(12) United States Patent
Quijano

(10) Patent No.: US 7,622,673 B2
(45) Date of Patent: Nov. 24, 2009

(54) CABLE MANAGEMENT SYSTEM

(75) Inventor: David Quijano, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 483 days.

(21) Appl. No.: 11/728,763

(22) Filed: Mar. 27, 2007

(65) Prior Publication Data

US 2008/0236858 A1  Oct. 2, 2008

(51) Int. Cl.
*H02G 3/08* (2006.01)

(52) U.S. Cl. ............... 174/50; 174/53; 174/101; 361/692; 361/687; 385/135; 340/825.79; 439/501

(58) Field of Classification Search .......... 174/50, 174/53, 58, 60, 64; 439/535, 501; 385/134–137; 361/724, 687, 689, 826, 692; 340/825.79; 220/4.02
See application file for complete search history.

(56) References Cited

U.S. PATENT DOCUMENTS

| | | | |
|---|---|---|---|
| 4,669,281 A | 6/1987 | Young | |
| 4,681,378 A | 7/1987 | Hellman, III | |
| 4,736,826 A | 4/1988 | White et al. | |
| 4,866,215 A | 9/1989 | Muller et al. | |
| 4,894,491 A | 1/1990 | Glau | |
| 5,018,052 A | 5/1991 | Ammon et al. | |
| 5,021,968 A | 6/1991 | Ferketic | |
| 5,272,988 A | 12/1993 | Kelley et al. | |
| 5,286,919 A * | 2/1994 | Benson et al. | 174/50 |
| 5,432,505 A | 7/1995 | Wise | |
| 5,473,994 A | 12/1995 | Foley et al. | |
| 5,515,037 A * | 5/1996 | Wise | 340/2.24 |
| 5,523,747 A | 6/1996 | Wise | |
| 5,541,586 A | 7/1996 | Wise | |
| 5,615,682 A | 4/1997 | Stratz, Sr. | |
| 5,640,482 A | 6/1997 | Barry et al. | |
| 5,769,374 A | 6/1998 | Martin et al. | |
| 5,804,765 A | 9/1998 | Siemon et al. | |
| 5,831,211 A | 11/1998 | Gartung et al. | |
| 5,833,332 A | 11/1998 | Marshall et al. | |
| 5,893,539 A | 4/1999 | Tran et al. | |
| 5,921,402 A | 7/1999 | Magenheimer | |
| 5,940,274 A | 8/1999 | Sato et al. | |
| 5,957,556 A | 9/1999 | Singer et al. | |
| 6,016,252 A | 1/2000 | Pignolet et al. | |

(Continued)

FOREIGN PATENT DOCUMENTS

KR  200199709  10/2006

OTHER PUBLICATIONS

HP Compaq 7000 Series Ultra Slim Desktop Integrated Work Center Stand—Setting up an Integrated Work Center, 2007 Hewlett-Packard Development Company, L.P., found at: http://h20000.www2.hp.com/bizsupport/TechSupport/Document.jsp?lang=en&cc=us &obj....

(Continued)

*Primary Examiner*—Dhiru R Patel

(57) ABSTRACT

Embodiments of the present invention are directed to a cable management system. In one embodiment, the cable management system includes a housing, a plurality of baffles extending from the housing, wherein the plurality of baffles are configured to resist movement of a connector relative to a port in a connection direction and receive the connector in an access direction generally traverse to the connection direction, and an access panel configured to enable access to the port and the connector.

22 Claims, 7 Drawing Sheets

U.S. PATENT DOCUMENTS

| | | | |
|---|---|---|---|
| 6,044,551 A | 4/2000 | Jarrett | |
| 6,050,849 A | 4/2000 | Chang | |
| 6,202,567 B1 | 3/2001 | Funk et al. | |
| 6,284,978 B1 | 9/2001 | Pavillard et al. | |
| 6,303,864 B1 | 10/2001 | Johnson et al. | |
| 6,305,556 B1 | 10/2001 | Mayer | |
| 6,326,547 B1 | 12/2001 | Saxby et al. | |
| 6,327,139 B1 | 12/2001 | Champion et al. | |
| 6,330,168 B1 | 12/2001 | Pedoeem et al. | |
| 6,363,198 B1 | 3/2002 | Braga et al. | |
| 6,407,933 B1 | 6/2002 | Bolognia et al. | |
| 6,409,134 B1 | 6/2002 | Oddsen, Jr. | |
| 6,427,936 B1 | 8/2002 | Noel et al. | |
| 6,435,106 B2 | 8/2002 | Funk et al. | |
| 6,435,354 B1 | 8/2002 | Gray et al. | |
| 6,483,709 B1 | 11/2002 | Layton | |
| 6,494,735 B1 | 12/2002 | Chen et al. | |
| 6,525,273 B1 | 2/2003 | Cunningham | |
| 6,533,723 B1 | 3/2003 | Lockery et al. | |
| 6,546,181 B1 | 4/2003 | Adapathya et al. | |
| 6,554,218 B2 | 4/2003 | Buyce et al. | |
| D477,325 S | 7/2003 | Theis et al. | |
| 6,600,665 B2 | 7/2003 | Lauchner | |
| 6,609,691 B2 | 8/2003 | Oddsen, Jr. | |
| 6,619,606 B2 | 9/2003 | Oddsen, Jr. et al. | |
| 6,637,104 B1 | 10/2003 | Masuda et al. | |
| 6,646,893 B1 | 11/2003 | Hardt et al. | |
| 6,713,678 B2 | 3/2004 | Masuda et al. | |
| 6,719,253 B2 | 4/2004 | Oddsen, Jr. | |
| 6,721,414 B1 | 4/2004 | Rojas et al. | |
| 6,724,970 B2 | 4/2004 | Adapathya et al. | |
| 6,726,167 B2 | 4/2004 | Oddsen, Jr. | |
| 6,805,248 B2 | 10/2004 | Champion et al. | |
| 6,811,039 B2 | 11/2004 | Chen et al. | |
| 6,856,505 B1 | 2/2005 | Venegas et al. | |
| 6,902,069 B2 | 6/2005 | Hartman et al. | |
| 6,915,994 B2 | 7/2005 | Oddsen, Jr. | |
| 6,935,875 B1 | 8/2005 | Holden | |
| 7,025,627 B2 * | 4/2006 | Rosenthal et al. | 439/501 |
| 7,027,706 B2 | 4/2006 | Diaz et al. | |
| 7,032,277 B2 | 4/2006 | Rolla et al. | |
| 7,040,491 B1 * | 5/2006 | Claprood et al. | 211/26 |
| 7,057,889 B2 | 6/2006 | Mata et al. | |
| 7,066,433 B2 | 6/2006 | Oddsen, Jr. | |
| 7,078,617 B1 | 7/2006 | Luciere | |
| 7,092,258 B2 | 8/2006 | Hardt et al. | |
| 7,097,047 B2 | 8/2006 | Lee et al. | |
| 7,100,880 B2 | 9/2006 | Oddsen, Jr. | |
| 7,101,215 B2 | 9/2006 | Woellner et al. | |
| 7,105,743 B2 * | 9/2006 | Caveney | 174/53 |
| 7,140,911 B1 * | 11/2006 | Rector et al. | 439/540.1 |
| 7,168,576 B2 | 1/2007 | Williams | |
| 7,255,640 B2 * | 8/2007 | Aldag et al. | 454/184 |
| 7,362,941 B2 * | 4/2008 | Rinderer et al. | 385/134 |
| 2001/0024904 A1 | 9/2001 | Fischer | |
| 2002/0066843 A1 | 6/2002 | Oddsen, Jr. et al. | |
| 2002/0073516 A1 | 6/2002 | Behar | |
| 2002/0074460 A1 | 6/2002 | Behar | |
| 2003/0026084 A1 | 2/2003 | Lauchner | |
| 2003/0037953 A1 | 2/2003 | Sarkinen et al. | |
| 2003/0066936 A1 | 4/2003 | Beck et al. | |
| 2003/0075646 A1 | 4/2003 | Womack et al. | |
| 2004/0065787 A1 | 4/2004 | Hardt et al. | |
| 2004/0130867 A1 | 7/2004 | Huettner et al. | |
| 2004/0149533 A1 | 8/2004 | Milano | |
| 2006/0264087 A1 | 11/2006 | Woellner et al. | |

OTHER PUBLICATIONS

Notification of Transmittal of the International Search Report and the Written Opinion of the International Searching Authority, or the Declaration mailed Aug. 7, 2008, 10 pg.

* cited by examiner

CABLE MANAGEMENT SYSTEM

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Electronic devices, such as computers, often utilize cabling systems to communicatively couple with other devices, power sources, and the like. A cabling system generally includes one or more cables that couple to a device via ports on the device. For example, a typical computer system may include a cabling system with individual ports and cables for receiving power, communicating with a network, and interfacing with any number of peripheral devices (e.g., printers, monitors, modems, and external memory devices). When a number of cables are utilized, the cables can become disorganized and unsightly. Additionally, in some situations, the cables may be susceptible to accidental disengagement from the device because they are unsecured or loosely coupled to the ports. Further, a cabling system can be a vulnerable point in device security. For example, unauthorized copying of valuable data from a computer may be facilitated by coupling an external memory to a port of the computer and copying or moving the data to the external memory via the port.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the present invention are directed to a cable management system configured for mounting to an electronic device (e.g., a computer) or that is integral with the electronic device. The cable management system may be positioned on the electronic device proximate ports (e.g., input/output ports) of the electronic device to facilitate management of cables that couple with the ports via cable connectors. For example, in accordance with present embodiments, the cable management system includes one or more baffles that facilitate organized placement of the cables by guiding the cables over defined routes through the cable management system. This organization of the cables may improve aesthetics of the cabling system and facilitate adjustment of the cables (e.g., adding, removing, and replacing cable connections) by an authorized user. Additionally, the cable management system may operate to secure connections between the cables and the ports by providing resistance to movement of the cable connectors away from the ports. Further, the cable management system may provide security against unauthorized access to the device by blocking direct access to the ports without removal or opening of at least a portion of the cable management system.

Figure 1:
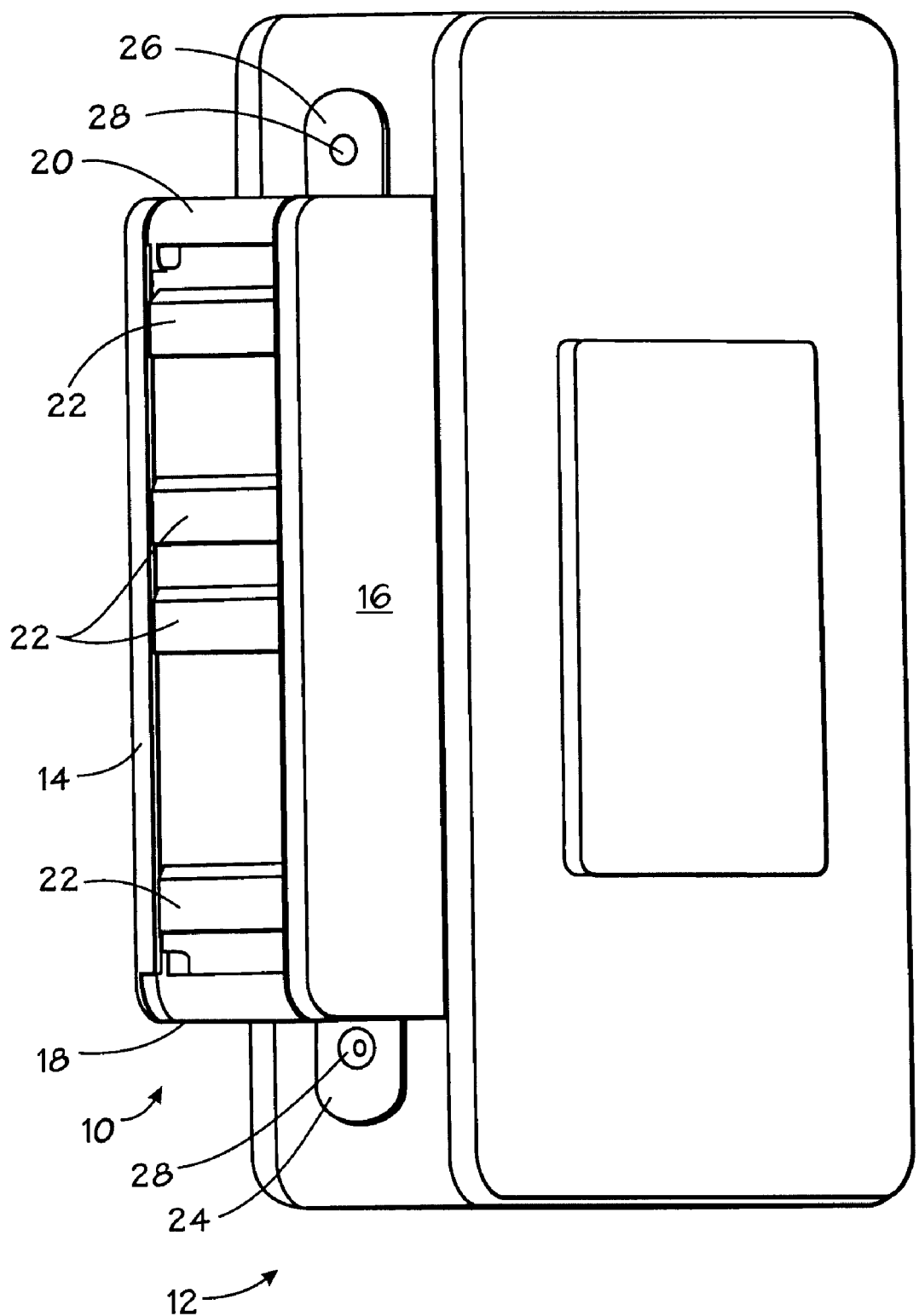
FIG. 1 is a perspective view of a cable management system coupled to a computer in accordance with an exemplary embodiment of the present invention.

FIG. 1 is a perspective view of a cable management system 10 coupled to a computer 12 in accordance with an exemplary embodiment of the present invention. In the illustrated embodiment, the computer 12 is shown as a thin client (e.g., a computer with relatively small dimensions that primarily utilizes a server for processing activities). However, in other embodiments, the computer 12 may include any number of electronic devices that utilize ports and/or cable connections. The computer 12 is coupled with the cable management system 10 such that the cable management system 10 covers a plurality of ports in the computer 12 that are configured to receive cable connectors. The cable management system 10 includes a first side wall 14, a second side wall 16, an upper wall 18, a lower wall 20, a plurality of baffles 22, an upper connector tab 24, and a lower connector tab 26. The side walls 14 and 16 are positioned in a substantially parallel orientation with respect one another, and the upper wall 18, the lower wall 20, and the plurality of baffles 22 extend between the side walls 14 and 16 in a substantially perpendicular orientation to the side walls 14 and 16. In other words, the first side wall 14 and the second sidewall 16 are disposed opposite one another and are coupled about the upper wall 18, the lower wall 20, and the baffles 22. It should be noted that a substantially parallel orientation may include an actual parallel orientation.

Figure 2:
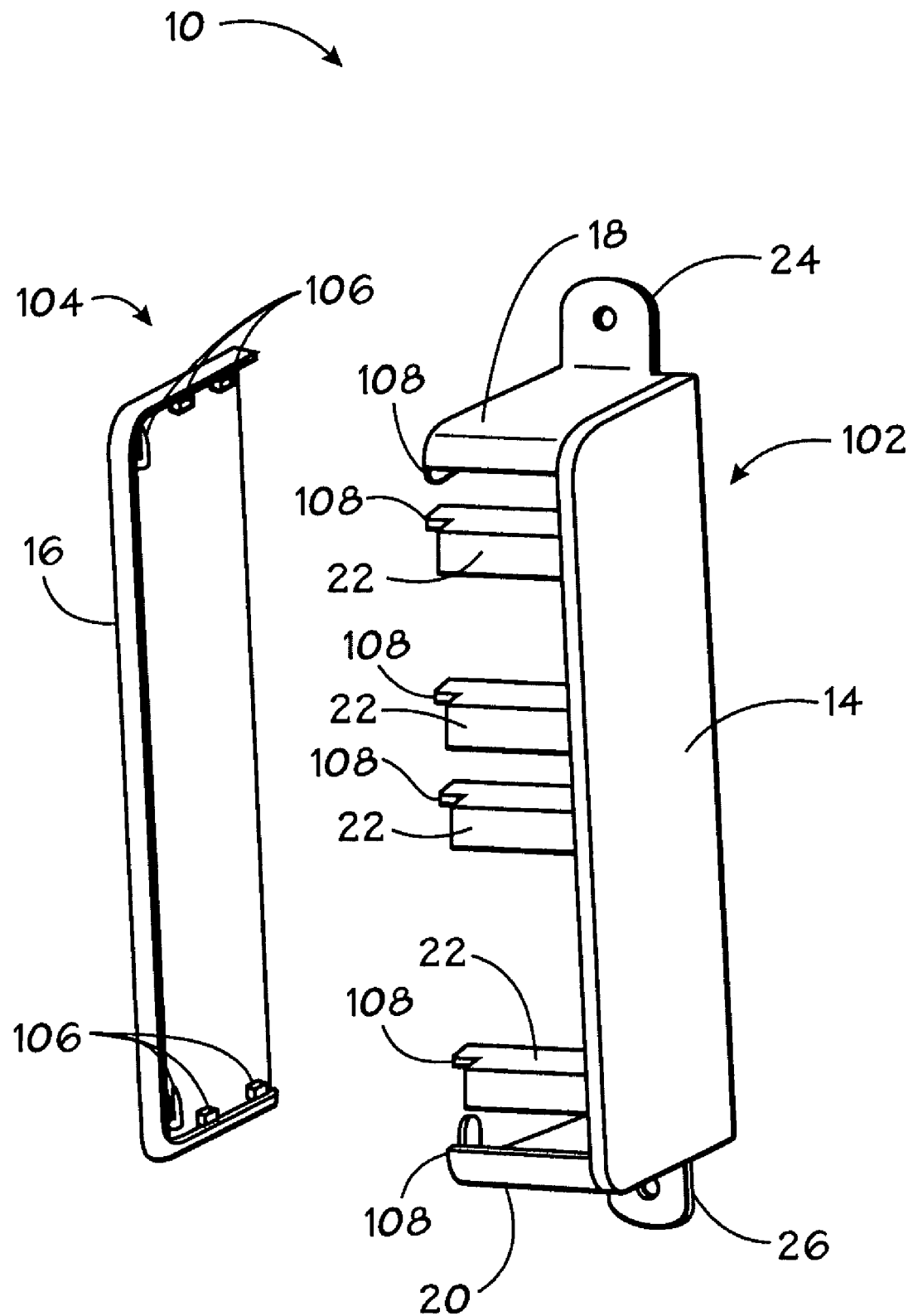
FIG. 2 is an exploded perspective view of a cable management system, wherein a main housing and a cover of the cable management system are separated in accordance with an exemplary embodiment of the present invention.

In accordance with some embodiments, the cable management system 10 is an assembly of two main components or parts. For example, as illustrated in FIG. 2, the cable management system 10 comprises a main housing 102 and an access cover 104 configured to couple with the main housing 102. The main housing 102 comprises a single assembly piece that integrates the first side wall 14, the upper wall 18, the lower wall 20, the plurality of baffles 22, the upper connector tab 24, and the lower connector tab 26 into one unit. The access cover 104 includes the second side wall 16 and coupling features 106 (e.g., snap fittings) configured to cooperate with corresponding coupling features 108 (e.g., snap receptacles) on the main housing 102 and/or computer 12 to hold the cable management system 10 together. When the access cover 104 is coupled to the main housing 102 in a closed position, the cable management system may resist or prevent unauthorized access to the contents of the cable management system 10. When the access cover 104 is removed or the cable management system 10 is in an open configuration, a user can access the contents of the cable management system 10 to rearrange cables, access device ports, and so forth. In some embodiments, the cable management system 10 includes a security mechanism that, when engaged, prevents unauthorized users from disassembling or opening the cable management system 10 (e.g., removing the access cover) without a key or specialized device.

Figure 3:
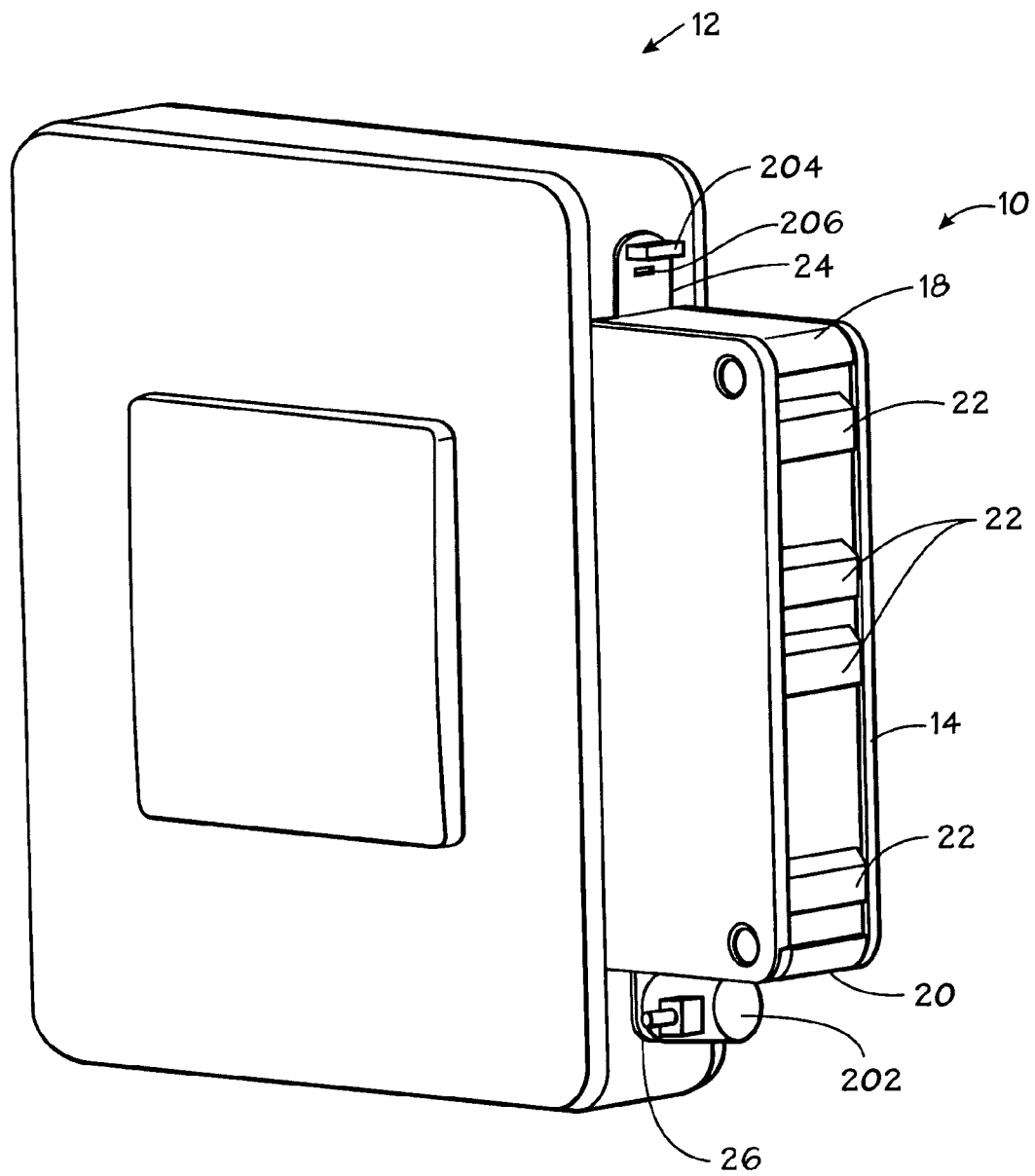
FIG. 3 is a perspective view of a cable management system coupled to a computer with a locking mechanism in accordance with an exemplary embodiment of the present invention.

In the embodiments illustrated by FIGS. 1 and 2, the upper and lower connector tabs 24 and 26, which are utilized to couple the cable management system 10 to the computer 12, extend from the upper and lower walls 18 and 20, respectively. In other embodiments, the connector tabs 24 and 26 may extend from different portions of the cable management system 10 (e.g., the side walls 14 and 16). Further, in some embodiments, a single connector tab may be included instead of two, or a different coupling mechanism may be employed. In the illustrated embodiment of FIG. 1, the connector tabs 24 and 26 receive a pair of fasteners 28 that pass through holes in the connector tabs 24 and into receptacles in the computer 12. The fasteners 28 may include screws, plugs, pins, latches, and so forth. Further, the fasteners 28 may be tamper resistant fasteners, such as security screws or other coupling features that prevent or resist unauthorized removal. Indeed, in some embodiments, the fasteners 28 may include or cooperate with locking devices. For example, in some embodiments, as illustrated in FIG. 3, one or both of the tabs 24 and 26 may cooperate with a locking mechanism 202 that prevents users from readily accessing device ports and/or cable connectors disposed within the cable management system 10 without the use of a key that opens the locking mechanism 202. In the illustrated embodiment, the locking mechanism 202 is coupled to the lower tab 26 and a lug 204 is coupled to the upper tab 24 via a keyhole slot 206. However, in other embodiments, both tabs 24 and 26 may couple with respective locking mechanisms 202. In one embodiment, the locking mechanism 202 may include a Kensington® lock available from Kensington Technology Group, which is located in Redwood Shores, Calif.

Figure 4:
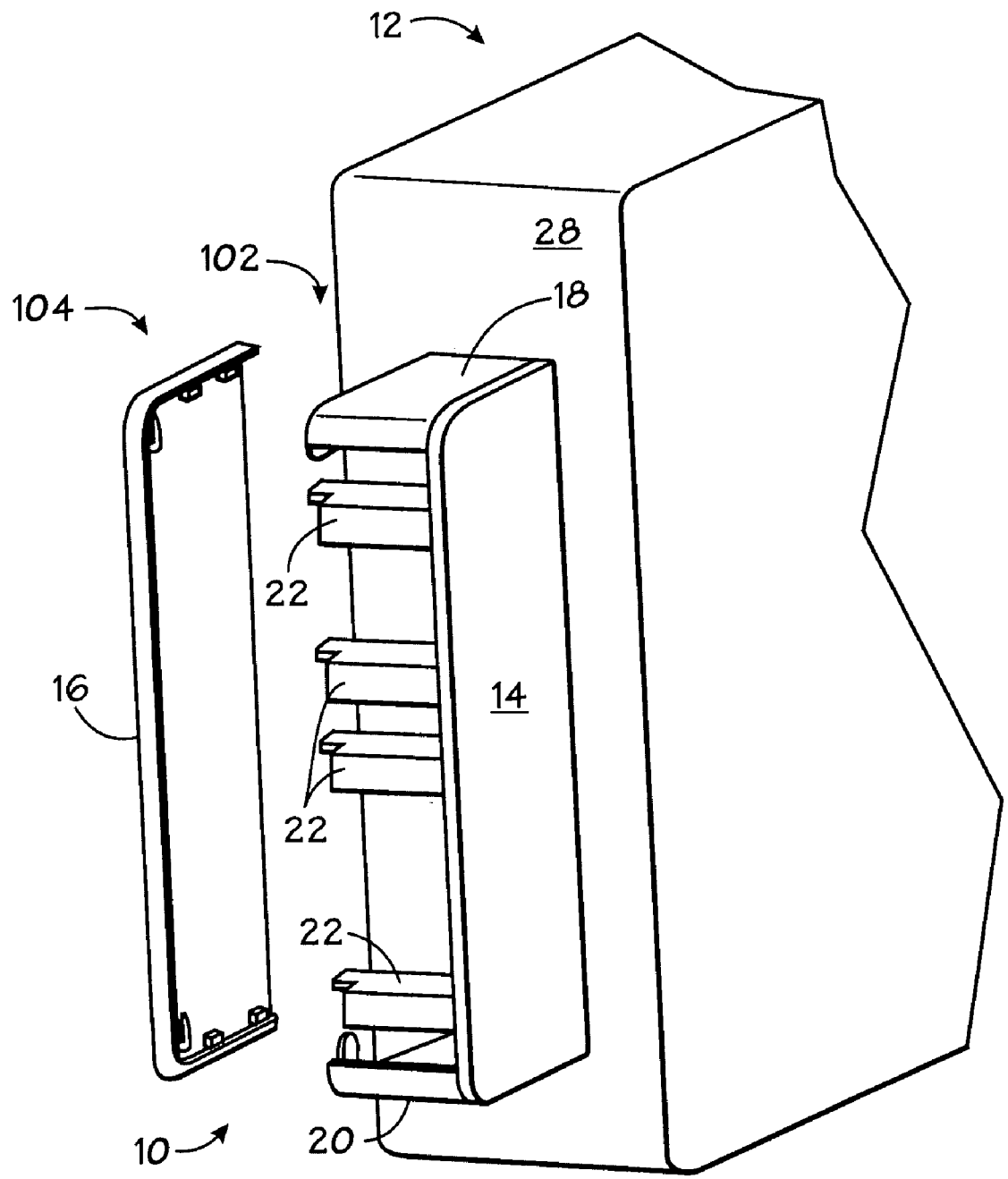
FIG. 4 is a perspective view of a cable management system as an integral part of a computer in accordance with an exemplary embodiment of the present invention.

In some embodiments, different connecting features may be utilized in place of or in addition to the connector tabs 24 and 26. For example, the cable management system 10 may include connection features that slide into and/or interlock with grooves or connection features of the computer 12, or portions of the cable management system 10 may directly adhere to the computer 12. Indeed, in some embodiments, a portion of the cable management system 10 may be integral with the computer 12, as illustrated in FIG. 4. For example, the first side wall 14, the upper wall 18, the lower wall 20, and the plurality of baffles 22 of the cable management system 10 may be integrated into a single unit (e.g., the main housing 102) that extends directly from a chassis 28 of the computer 12. The second side wall 16 may operate as a cover (e.g., the access cover 104) that is configured to removably couple with the main housing 102 extending from the computer 12. In other words, the second side wall 16 may be configured to attach to the other cable management system features to form a protective enclosure (i.e., the cable management system 10), and detach from the other cable management system features to enable access to contents of the cable management system 10.

Figure 5:
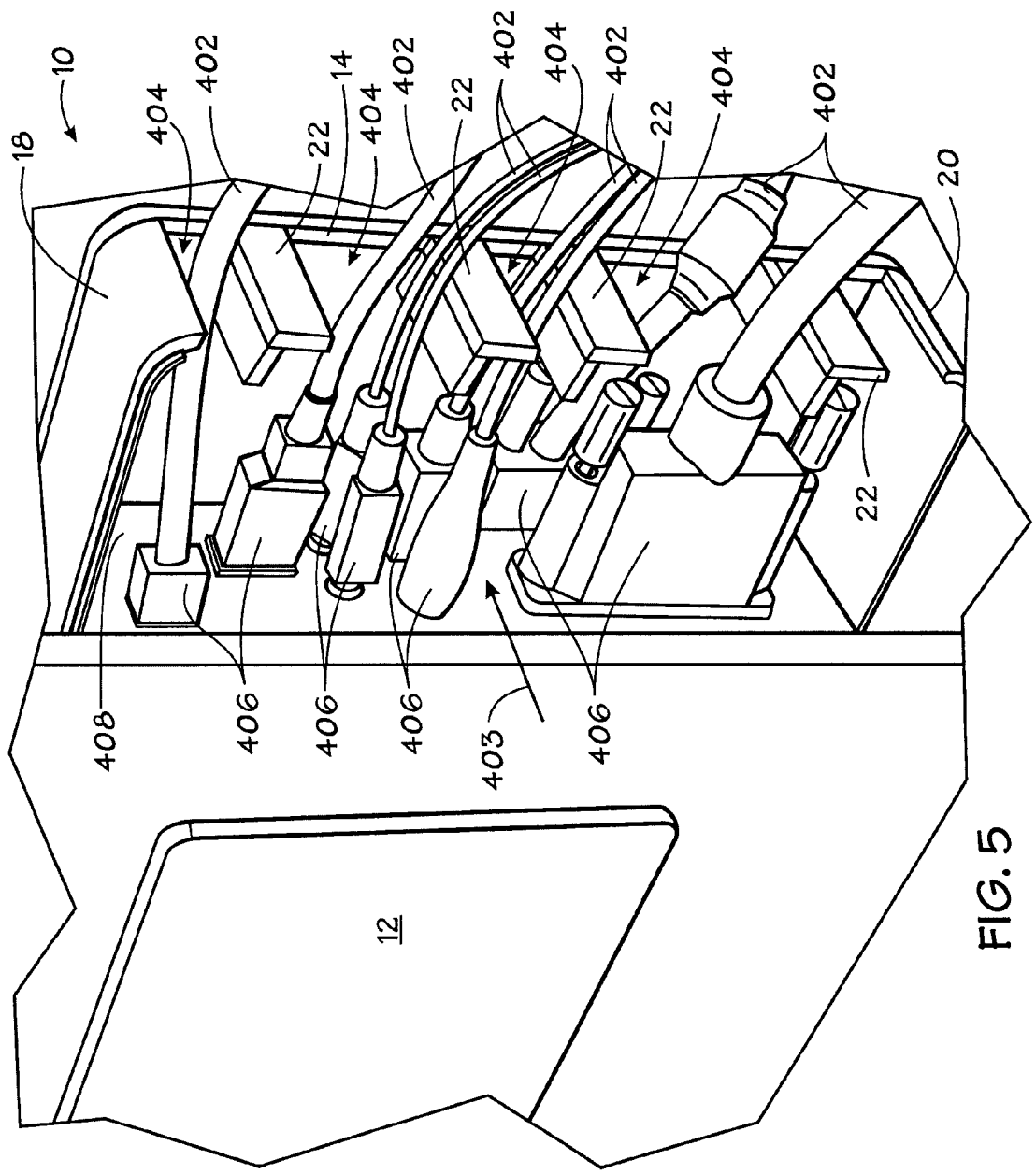
FIG. 5 is a perspective view of a cable management system coupled to a computer, wherein the cable management system is in an open configuration with a plurality of cables threaded through openings in the cable management system and a plurality of cable connectors stored in the cable management system in accordance with an exemplary embodiment of the present invention.

In accordance with present embodiments, a user may remove the cover 104 of the cable management system 10 and route cables 402 through openings 404 formed in the cable management system 10 by the positioning of the baffles 22 with respect to the side walls 14 and 16 and/or the upper and lower walls 18 and 20. In other words, as illustrated in FIG. 5, the cables 402 may be inserted into the cable management system 10 in an access direction 403 when the cable management system is in an open configuration. FIG. 5 is a perspective view of the cable management system 10 with the cover 104 removed and with the various cables 402 routed over the baffles 22 and with the associated cable connectors 406 stored in a cavity 408 defined within the cable management system 10. In the illustrated embodiment, the depth of the side walls 14 and 16 (i.e., the length of the sidewalls 14 and 16 from the farthest point away from the computer 12 to the point adjacent the computer 12) and the placement of the baffles 22 correspond to the size and arrangement of cables 402 within the cable management system 10. Likewise, the depth of the side walls 14 and 16 and the placement of the baffles 22 correspond to the position of cable connectors 406 on the computer 12. For example, in the illustrated embodiment, the cable management system 10 is deep enough to house the connectors 406 when coupled to the computer 12 and shallow enough to resist disconnection of the connectors 406 from the computer 12 by biasing the connectors 406 and/or the associated cables 402 toward the computer 12 with the baffles 22. In addition to providing a secure coupling, this limiting of the size of the cable management system 10 to the size required to sufficiently accommodate the connectors 406 conserves space. Thus, the cable management system 10 may be utilized with small electronic devices, such as thin clients.

Figure 6:
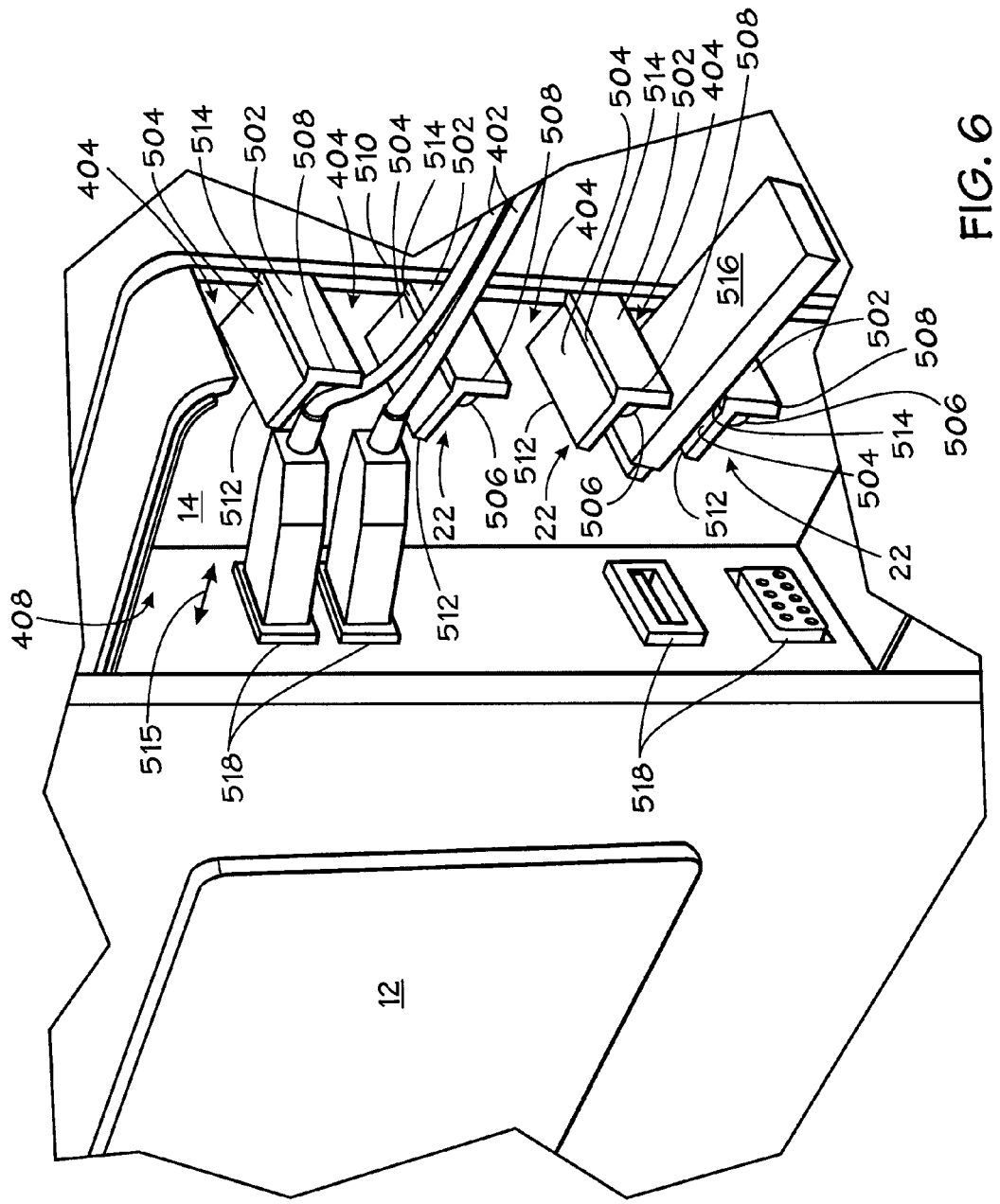
FIG. 6 is a perspective view of a portion of a cable management system illustrating the resistance to coupling of a memory device to a port covered by the cable management system in accordance with an exemplary embodiment of the present invention.

As illustrated by FIG. 6, the baffles 22 include a face portion 502 and a guide portion 504 that are arranged with respect to each other such that each of the baffles 22 has a cross-section that is L-shaped. An angle 506 formed between the face portion 502 and the guide portion 504 may vary depending on application. For example, sides 508 of the face portion 502 may be substantially parallel with a length 510 of the side walls 14 and 16. The guide portion 504 may slope downward or upward from a first side 512 of the guide portion 504 nearest the computer 12 to a second side 514 of the guide portion 504 adjacent the face portion 502. The angle 506 of the guide portion 504 with respect to the side walls 14 and 16 and/or the face portion 502 may serve to dress the cables 402 in a certain direction and/or restrict access to the contents of the cavity 408 formed by the cable management system 10. For example, the guide portion 504 may guide the cables 402 downward as they exit the cable management system 10 to improve aesthetics and prevent movement of the cables 402 by biasing them against one another and the baffles 22. In another example, the guide portion 504 may be angled such that a connector or a memory device is hindered from connecting to the computer 12.

The cable management system 10 may block insertion or movement of connectors with respect to the computer 12 in a connection direction 515. In the illustrated embodiment of FIG. 6 a memory device 516 (e.g., a flash memory) is being guided away from coupling to one of a number of computer ports 518 (e.g., a USB port) disposed in the cavity 408 of the cable management system 10. Indeed, as the memory device 516 is inserted through the opening 404 formed by the baffles 22 in the cable management system 10, the guide portion 504 forces the memory device 516 away from the location of the corresponding port 518. Further, the face portion 502 prevents direct access. These features of the cable management system 10 may prevent unauthorized users from accessing information stored on the computer 12 via the ports 518 when the cable management system 10 is secured (e.g., closed, sealed and/or locked), while enabling access to cables 402 that are put in place by a user before securing the cable management system 10. In some embodiments, the angle 506 may be adjustable to allow users to accommodate different cable arrangements and so forth. For example, an authorized user may change the angle 506 by repositioning the face portion 502 or the guide portion 504. In the illustrated embodiment, the face portion 502 is integral with the guide portion 504. However, in some embodiments the face portion 502 and the guide portion 504 are separate pieces.

Figure 7:
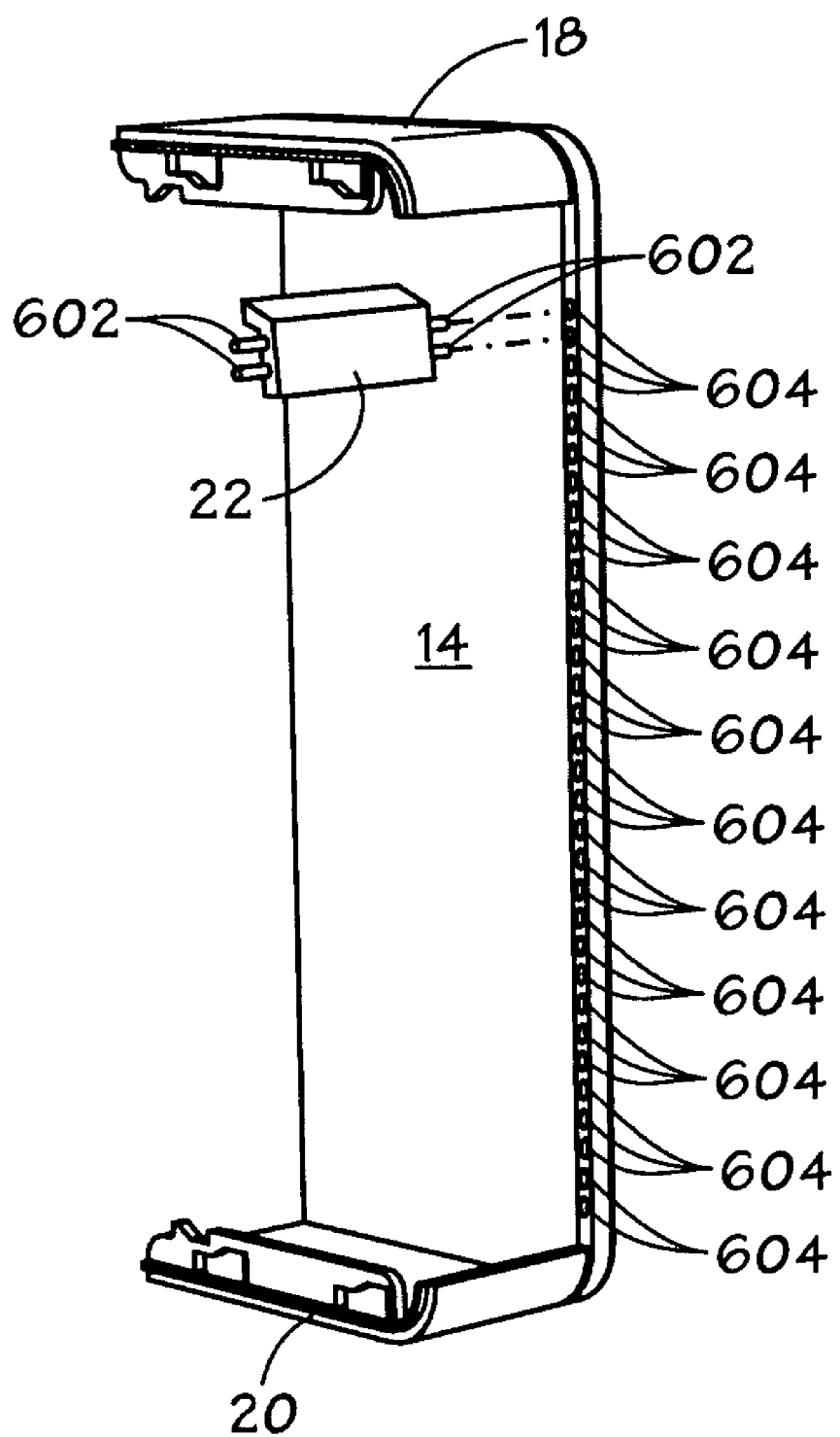
FIG. 7 is a perspective view of a portion of a cable management system, wherein a baffle is configurable in accordance with an exemplary embodiment of the present invention.

As set forth above, the baffles 22 may be arranged to interfere with the cables 402 and cable connectors 406 to resist movement and disconnection of the cables from the computer 12. In some embodiments, as illustrated by FIG. 7, the baffles 22 may be positionally adjustable. Accordingly, a user may simply arrange the baffles 22 along the cable management system 10 in various positions as desired to correspond to a particular arrangement of cables 402 and ports 518 in a computer system. For example, in the illustrated embodiment of FIG. 7, the baffles 22 include a coupling feature 602 (e.g., a tab) that facilitates connection to the side walls 14 and 16 with any of various coupling features 506 (e.g., a receptacle) disposed along the side walls 14 and 16.

What is claimed is:

1. A system, comprising: a housing comprising; a detachable access cover; and a plurality of baffles extending from the housing; wherein each of the plurality of baffles comprises a face portion to separate a plurality of cables within the housing and a guide portion to direct the plurality of cables within the housing; wherein the plurality of baffles are configured to resist movement of at least one connector in a connection direction when the access cover is attached; and wherein the plurality of baffles are configured to permit the movement of receive the at least one connector in an access direction when the access cover is removed.

2. The system of claim 1, wherein each of the plurality of baffles comprises an L-shaped cross-section.

3. The system of claim 1, wherein the guide portion extends from adjacent one end of the face portion toward an upper end or lower end of the housing.

4. The system of claim 1, comprising an upper tab extending from an upper wall of the housing and a lower tab extending from a lower wall of the housing, wherein the upper and lower tabs are configured to cooperate with a coupling to secure the housing to an electronic device.

5. The system of claim 1, wherein the plurality of baffles are positionally adjustable relative to the housing.

6. The system of claim 5, wherein each of the plurality of baffles comprises a coupling feature configured to couple with a mating feature of the housing.

7. The system of claim 1, comprising a fastener configured to secure the housing to an electronic device.

8. The system of claim 7, wherein the fastener comprises a locking mechanism, a security screw, or both.

9. The system of claim 1, wherein a cavity formed by the housing, the plurality of baffles, and the access cover is configured to be large enough to sufficiently cover the connector and small enough to provide resistance to movement of the connector.

10. The system of claim 1, wherein an angle between first and second portions of each of the plurality of baffles is adjustable.

11. The system of claim 10, wherein the angle is configured to deflect the connector away from the port when the connector is inserted between the plurality of baffles into the housing in the connection direction.

12. The system of claim 1, further comprising: a computer comprising a port configured to facilitate communicative coupling with a peripheral device or power source; and wherein the housing is disposed proximate at least a portion of the port.

13. The system of claim 12, wherein each of the plurality of baffles comprises an L-shaped cross-section.

14. The system of claim 12, wherein an angle between first and second portions of each of the plurality of baffles is adjustable.

15. The system of claim 14, wherein the angle is configured to deflect the connector away from the port.

16. A system, comprising: a housing having a first side wall; a second side wall disposed opposite the first side wall; a plurality of baffles are mounted on the first side wall and extending between the sidewalls, wherein each of the plurality of baffles comprises a face portion having a height extending substantially parallel to the first side wall and a width extending substantially perpendicular to the first side wall and a guide portion having a width extending substantially perpendicular to the first side wall and a depth extending along the sidewall at an angle transverse to the face portion; wherein the face portion separates a plurality of cables within the housing; and wherein the guide portion directs the plurality of cables within the housing.

17. The system of claim 16, comprising:
upper wall extending between the first and second side walls in a direction substantially perpendicular to the first and second sidewalls at an upper end of the first and second side walls; and
a lower wall extending between the first and second side walls in the direction substantially perpendicular to the first and second sidewalls at a lower end of the first and second sidewalls.

18. The system of claim 16, wherein the plurality of baffles are arranged based on a location of ports on an electronic device such that the plurality of baffles deflect direct coupling of a connector to the ports.

19. The system of claim 16, wherein the plurality of baffles are positionally adjustable.

20. The system of claim 16, comprising a fastener configured to secure the first and second sidewalls to an electronic device.

21. The system of claim 20, wherein the fastener comprises a locking mechanism, a security screw, or both.

22. The cable management system of claim 16, wherein the face portion and the guide portion are separate components.

* * * * *